United States Patent
Akutsu et al.

(10) Patent No.: US 6,930,756 B2
(45) Date of Patent: Aug. 16, 2005

(54) ELECTRON BEAM EXPOSURE APPARATUS AND SEMICONDUCTOR DEVICE MANUFACTURING METHOD

(75) Inventors: Kotaro Akutsu, Saitama (JP); Shin Matsui, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 22 days.

(21) Appl. No.: 10/617,682

(22) Filed: Jul. 14, 2003

(65) Prior Publication Data

US 2004/0012765 A1 Jan. 22, 2004

(30) Foreign Application Priority Data

Jul. 18, 2002 (JP) ........................................ 2002-210159

(51) Int. Cl.⁷ .............................................. G03B 27/42
(52) U.S. Cl. ..................... 355/53; 355/67; 250/491.1; 250/492.2; 310/10; 310/12
(58) Field of Search .............................. 355/53, 67, 72, 355/75; 250/491.1, 492.2; 310/10, 12

(56) References Cited

U.S. PATENT DOCUMENTS 5,717,482 A    2/1998  Akutsu et al. ................ 355/53
5,858,587 A    1/1999  Yamane et al. ................ 430/22
5,864,142 A    1/1999  Muraki et al. ........... 250/491.1
6,054,713 A    4/2000  Miyake et al. ......... 250/492.24
6,392,243 B1 * 5/2002  Muraki ..................... 250/491.1

FOREIGN PATENT DOCUMENTS

JP      5-89815      4/1993
JP      9-330867     12/1997

* cited by examiner

Primary Examiner—D. Rutledge
(74) Attorney, Agent, or Firm—Fitzpatrick, Cella, Harper & Scinto

(57) ABSTRACT

An electron beam exposure apparatus which exposes a substrate with a predetermined pattern using one or a plurality of electron beams. The apparatus includes a substrate stage on which a substrate is mounted, a transfer stage which drives the substrate stage on an X-Y plane, an electromagnetic actuator which drives the substrate stage in a rotation direction about a Z-axis with respect to the transfer stage, and a measuring system which measures a position of the substrate stage in the rotation direction about the Z-axis using a measuring beam along a direction perpendicular to the plurality of electron beams.

15 Claims, 11 Drawing Sheets

ELECTRON BEAM EXPOSURE APPARATUS AND SEMICONDUCTOR DEVICE MANUFACTURING METHOD

FIELD OF THE INVENTION

The present invention relates to an electron beam exposure apparatus and a semiconductor device manufacturing method and, more particularly, to an electron beam exposure apparatus which performs pattern drawing using electron beams and a semiconductor device manufacturing method using the same.

BACKGROUND OF THE INVENTION

A lithography technique for reducing and transferring various patterns formed on a mask onto a wafer with light is used to manufacture semiconductor devices. A mask pattern for use in lithography is required to have an extremely high degree of accuracy. Hence, to form a mask pattern, an electron beam exposure apparatus capable of drawing fine patterns is employed. An electron beam exposure apparatus is also employed to directly draw a fine pattern on a wafer without any masks.

Electron beam exposure apparatuses include, e.g., a point-beam type apparatus which uses spot-like beams and a variable rectangular beam type apparatus which uses beams each having a variable-size rectangular cross section. A general electron beam exposure apparatus comprises an electron gun portion which generates electron beams, an electron optical system for guiding electron beams emitted from the electron gun portion onto a sample, a stage system for scanning the entire surface of the sample with electron beams, and an objective deflector for positioning electron beams on the sample at high accuracy.

A region in which the objective deflector can position electron beams needs to have a width of about several mm in order to minimize any aberrations in an electron optical system. As for the size of the sample, when a silicon wafer is employed as the sample, its diameter is about 200 to 300 mmφ. As for the size of a glass substrate to be used as a mask, its size is about 150 mm square. For this reason, a stage which enables scanning of the entire surface of the sample with electron beams is adopted.

To perform high-accuracy exposure, any shift in posture and position of the stage are measured. Since the response of positioning electron beams is extremely high, the amount of shift is generally adjusted not by using a system arrangement for improving the mechanical and control characteristics of the stage but by positioning electron beams with a deflector which deflects the electron beams.

Hence, a conventional stage only has to move in the direction of the X-Y plane. Additionally, a conventional stage has certain constraints, i.e., the stage must be arranged in a vacuum chamber and is not allowed to cause any variation in magnetic field, which may affect the positioning of electron beams. For this reason, a conventional stage comprises limited contact mechanism elements such as a rolling guide, ball screw actuator, and the like.

However, a contact mechanical element suffers from problems about lubrication, particles, and the like. To solve such problems, there is disclosed an X-Y transfer stage comprising a stage arrangement which includes a vacuum air guide and a linear motor, and has two degrees of freedom in a plane direction, as shown in FIG. 5. According to the stage arrangement of FIG. 5, a stage can accelerate extremely smoothly in the X and Y directions and the stage can be hardly disturbed by a guide in alignment in the X and Y directions.

An electron beam exposure apparatus must have a higher speed (throughput) in lithography. To achieve this, there is disclosed, e.g., a multi electron beam exposure apparatus which irradiates the surface of a sample with a plurality of electron beams in accordance with design coordinates, scans the sample surface by deflecting the plurality of electron beams in accordance with the design coordinates, and individually turns on/off the plurality of electron beams in accordance with a pattern to be drawn, as disclosed in Japanese Patent Laid-Open No. 9-330867. A multi electron beam exposure apparatus can draw an arbitrary pattern with a plurality of electron beams and thus can increase the throughput.

FIG. 6 is a view showing the outline of a multi electron beam exposure apparatus. Electron guns 501a, 501b, and 501c can individually turn on/off electron beams. A reduction electron optical system 502 reduces and projects a plurality of electron beams from the electron guns 501a, 501b, and 501c onto a wafer 503. A deflector 504 deflects the plurality of reduced and projected electron beams onto the wafer 503.

FIG. 7 shows how the multi electron beam exposure apparatus of FIG. 6 scans a wafer with a plurality of electron beams. White circles represent beam reference positions (BS1, BS2, and BS3) at which each electron beam comes incident on the wafer when it is not deflected by the deflector 504. The beam reference positions (BS1, BS2, and BS3) are plotted along a design orthogonal coordinate system (Xs, Ys). The respective electron beams move along the design orthogonal coordinate system (Xs,Ys) with reference to the beam reference positions (BS1, BS2, and BS3) and scan exposure fields (EF1, EF2, and EF3) for the respective electron beams. The exposure fields for the respective electron-beams are arranged adjacent to each other. By sequentially exposing these exposure fields, the exposure fields over the entire wafer are exposed. However, since lithography requires higher accuracy and higher speed, it is necessary to suppress a degradation in drawing accuracy due to the yawing component of a stage supporting a substrate.

To this end, there is available a method of correcting a yawing component using a deflector in an electron beam exposure apparatus. Even with this method, a correction control system using a deflector inevitably becomes complicated, thus resulting in an increase in cost and a decrease in throughput. Though a conventional stage arrangement has excellent alignment characteristics in the X and Y directions, it is difficult to greatly reduce a yawing component.

If scanning and exposure are performed in a stage by a multi electron beam exposure scheme, a yawing component is more likely to occur as a positional shift from each beam than by a single-beam exposure scheme such as a point-beam type exposure scheme, variable rectangular beam type exposure scheme, or the like.

More specifically, in a conventional single-beam exposure apparatus, a beam position is located at the intersection point of measurement axes for measuring the position of a stage in two axial directions on a plane. For this reason, a shift in the plane direction due to a distance from the beam position regardless of the position of the rotation center of yawing is automatically corrected by position feedback. If part of the shift is left uncorrected, a deflector may correct the part as a stage positional shift. In this case, a rotation component will be left uncorrected. Assume that the size of an exposure field is 10 µm square, and that a 100-µrad stage rotates. In this case, though a positional shift of up to 1 nm may occur in the in-plane direction of a wafer within a drawing spot, this shift can be neglected.

Consider the case of a multi electron beam exposure apparatus using a plurality of beams. For example, if the plurality of beams comprises two beams, and a distance between the beams is 10 mm, only one beam can be positioned at the intersection point of the measurement axes. As for one beam, a positional shift from a beam position at the intersection point is the same as that described in the case of a single-beam exposure apparatus. As for the other beam, a positional shift occurs in accordance with a distance from the intersection point of the measurement axes. If a 100-µ rad stage rotates with the above-mentioned beam distance, a difference between the positional shift amounts of the respective beams becomes 1000 nm.

To correct these positional shift amounts, rotation correction may collectively be performed for all the beams by a rotary deflector or correction may separately be performed for the beams by respective deflectors. Either method, however, inevitably has a complicated control system, thus resulting in an increase in cost and a decrease in throughput.

Under the circumstances, there is a need for an electron beam exposure apparatus having high-frequency band control characteristics in the yawing direction of a stage in order to reduce a degradation in drawing accuracy due to the yawing component of the stage and to realize high-accuracy exposure.

SUMMARY OF THE INVENTION

The present invention has been made in consideration of the above-mentioned problems, and has as its object to provide an electron beam exposure apparatus capable of reducing a degradation in drawing accuracy and performing high-accuracy exposure.

According to the first aspect of the present invention, there is provided an electron beam exposure apparatus which exposes a substrate with a predetermined pattern using one or a plurality of electron beams, comprising a substrate stage on which a substrate is mounted, a transfer stage which drives the substrate stage on an X-Y plane, and an electromagnetic actuator which drives the substrate stage in a rotation direction about a Z-axis with respect to the transfer stage.

According to a preferred embodiment of the present invention, preferably, the electromagnetic actuator includes a movable element and a stator, the movable element being fixed on the substrate stage, and the stator being fixed on the transfer stage.

According to a preferred embodiment of the present invention, the movable element and the stator are preferably in non-contact with each other.

According to a preferred embodiment of the present invention, preferably, the movable element comprises a magnet, and the stator comprises a coil.

According to a preferred embodiment of the present invention, preferably, the apparatus further comprises a Z actuator for driving the substrate stage in a Z direction and a tilt frame which is supported on the transfer stage through the Z actuator, and the substrate stage is connected to the tilt frame.

According to a preferred embodiment of the present invention, preferably, the tilt frame has a connecting member with a degree of freedom in the rotation direction about the Z-axis, and the substrate stage is supported on the tilt frame through the connecting member.

According to a preferred embodiment of the present invention, the apparatus preferably further comprises a second electromagnetic actuator arranged between the substrate stage and the transfer stage to drive the substrate stage in at least one of a rotation direction about an X-axis, a rotation direction about a Y-axis, a Z-axis direction, and an X-Y direction with respect to the transfer stage.

According to a preferred embodiment of the present invention, preferably, the electromagnetic actuator comprises a plurality of electromagnetic actuators, and the plurality of electromagnetic actuators are combined to drive the substrate stage with six degrees of freedom.

According to a preferred embodiment of the present invention, each electromagnetic actuator and the substrate stage are preferably arranged on opposite sides of a barycenter of the transfer stage in the Z-axis direction.

According to a preferred embodiment of the present invention, the electromagnetic actuator is preferably coated with an electromagnetic shield.

According to the second aspect of the present invention, there is provided an electron beam exposure apparatus using a plurality of electron beams, the apparatus comprising a substrate stage on which a substrate is mounted, a transfer stage which drives the substrate stage on an X-Y plane, and an electromagnetic actuator which drives the substrate stage, in a rotation direction about a Z-axis and a direction perpendicular to an array direction of the plurality of electron beams, with respect to the transfer stage.

According to a preferred embodiment of the present invention, preferably, the apparatus further comprises a Z actuator for driving the substrate stage in a Z direction and a tilt frame which is supported on the transfer stage through the Z actuator, and the substrate stage is connected to the tilt frame.

According to a preferred embodiment of the present invention, preferably, the tilt frame has a connecting member with a degree of freedom in the rotation direction about the Z-axis, and the substrate stage is supported on the tilt frame through the connecting member.

According to a preferred embodiment of the present invention, the tilt frame preferably further comprises a second electromagnetic actuator which is actuated in a direction perpendicular to the array direction of the plurality of electron beams.

According to the third aspect of the present invention, there is provided a semiconductor device manufacturing method comprising a coating step of coating a substrate with a photosensitive agent, an exposure step of transferring a pattern onto the substrate coated with the photosensitive agent using an electron beam exposure apparatus, and a development step of developing the photosensitive agent on the substrate, onto which the pattern is transferred in the exposure step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

[First Embodiment]

Figure 1:
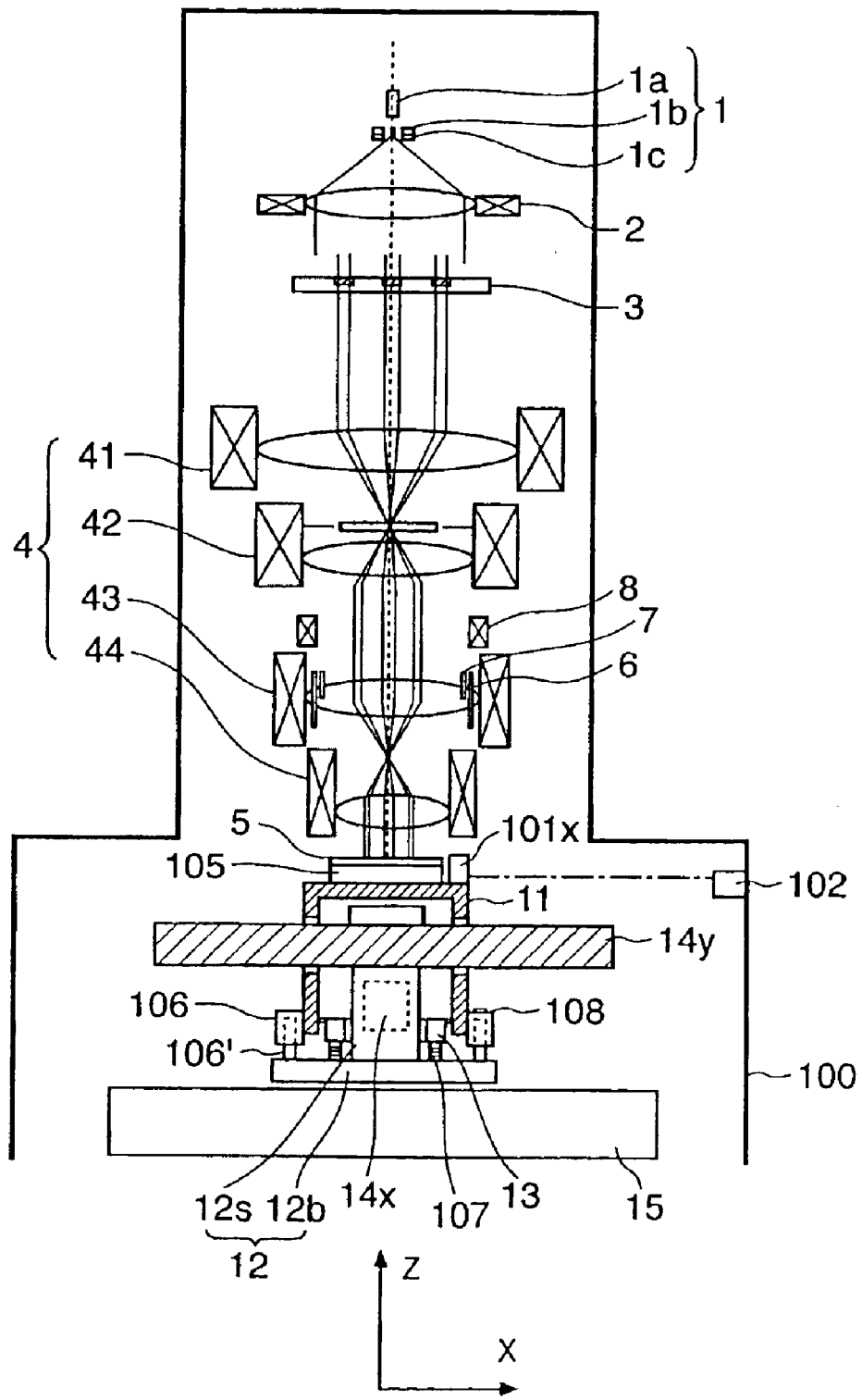
FIG. 1 is a view showing an electron beam exposure apparatus according to the first embodiment of the present invention.

FIG. 1 is a view showing an electron beam exposure apparatus according to a preferred embodiment of the present invention.

An electron gun 1 comprises a cathode 1a, grid 1b, and anode 1c. Electrons emitted from the cathode 1a form a crossover image between the grid 1b and anode 1c (this crossover image will be referred to as a light source hereinafter).

Electrons emitted from the light source form a substantially parallel electron beam through a condenser lens 2, whose front focal position is located at the light source position. The substantially parallel electron beam comes incident on an element electron optical system array 3. The element electron optical system array 3 is formed by arranging a plurality of element electron optical systems, each comprising a blanking electrode, an aperture, and an electron lens, in a direction perpendicular to the optical axis parallel to the Z-axis. The element electron optical system array 3 will be described in detail later.

The element electron optical system array 3 forms a plurality of intermediate images of the light source. The respective intermediate images are reduced and projected onto a wafer 5 serving as a substrate by a reduction electron optical system 4 (to be described later), to form light source images on the wafer 5. The respective elements of the element electron optical system array 3 are set such that the spacing between adjacent light source images on the wafer 5 is an integer multiple of the size of each light source image. Additionally, in the element electron optical system array 3, the position of each intermediate image in the direction of the optical axis is differently adjusted in accordance with the curvature of field of the reduction electron optical system 4. The element electron optical system array 3 also corrects, in advance, an aberration that occurs when each intermediate image is reduced and projected onto the wafer 5 by the reduction electron optical system 4.

The reduction electron optical system 4 comprises a symmetric magnetic tablet including a first projection lens 41 (43) and a second projection lens 42 (44). The distance between the two lenses 41 and 42 is f1+f2 where f1 is the focal length of the first projection lens 41 (43) and f2 is the focal length of the second projection lens 42 (44). The object point on the optical axis is at the focal position of the first projection lens 41 (43), and the image point on the optical axis is formed on the focal point of the second projection lens 42 (44). This image is reduced to f2/f1. The two lens magnetic fields are determined to act in the opposite directions. Hence, theoretically, Seidel aberrations other than five aberrations, i.e., spherical aberration, isotropic astigmatism, isotropic coma, curvature of field, and on-axis chromatic aberration, and chromatic aberrations concerning rotation and magnification are cancelled.

A deflector 6 deflects a plurality of electron beams from the element electron optical system array 3 to displace a plurality of light source images on the wafer 5 by substantially the same displacement amount in the X- and Y-axis directions. The deflector 6 includes a main deflector, which is used when a deflection width is large, and a subdeflector, which is used when the deflection width is small (both not shown). The main deflector is an electromagnetic deflector, while the subdeflector is an electrostatic deflector.

A dynamic focus coil 7 corrects the focal position shift of a light source image formed by the deflection aberration that occurs when the deflector 6 is actuated. A dynamic stigmatic coil 8 corrects deflection aberration caused by deflection, i.e., astigmatism, in the same manner as the dynamic focus coil 7.

A θZ tilt stage 11 serving as a substrate stage has a wafer 5 on it and can move in the direction of the optical axis (direction substantially parallel to the Z-axis), the rotation direction (θ direction) about the Z-axis, and the tilt direction.

An X-Y transfer stage 12 (to be referred to as a center slider hereinafter) serving as a transfer stage moves on a stage base 15 and drives the θZ tilt stage 11 in the X and Y directions.

Figure 2:
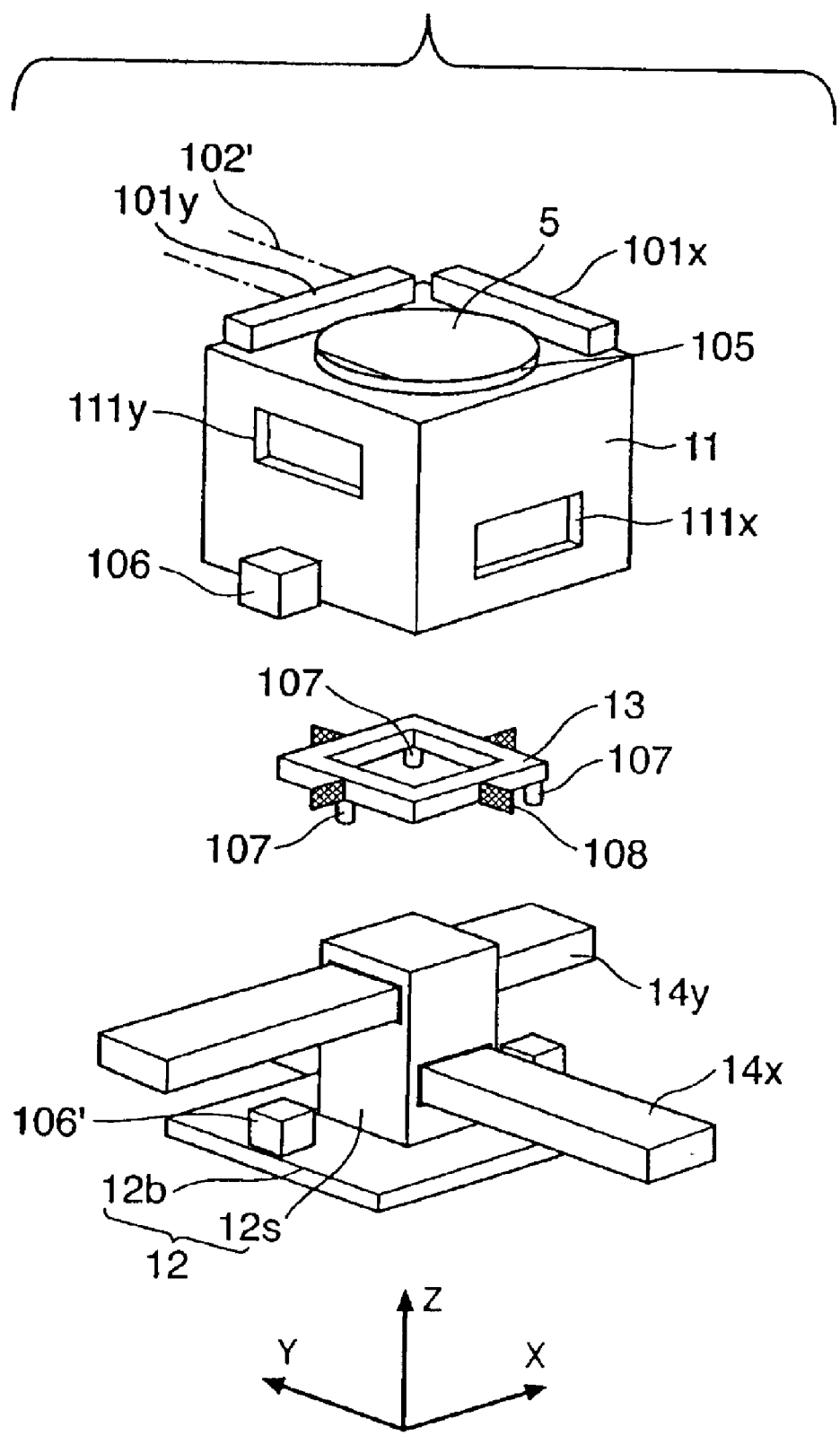
FIG. 2 is a view showing in detail a stage used in the electron beam exposure apparatus of FIG. 1.

FIG. 2 is a view showing in detail the stage (the θZ tilt stage 11 and center slider 12) used in the electron beam exposure apparatus of FIG. 1. As shown in FIG. 2, the θZ tilt stage 11 comprises a substrate holder 105 which holds, e.g., the wafer 5 on its surface and reflection mirrors 101x and 101y for position measurement. The θZ tilt stage 11 has a cage structure surrounding the center slider 12 and has apertures 111x and 111y, through which an X movable guide 14x and a Y movable guide 14y extend.

The position of the θZ tilt stage 11 in the X and Y directions is measured by, e.g., a laser interferometer 102 held by a sample chamber 100 shown in FIG. 1, with reference to the inner wall of the sample chamber 100. By using the reflection mirrors 101x and 101y, the θZ tilt stage 11 is also measured in the θ and tilt directions. θ measurement 102' is preferably performed from a side perpendicular to the array of a plurality of beams. The position in the Z-axis direction is detected by an optical sensor with non-photosensitive light. As a servo sensor, a vacuum encoder may be employed.

As shown in FIG. 2, the center slider 12 can move in the X and Y directions on the X-Y plane, which is perpendicular to the direction (substantially parallel to the Z-axis) of the optical axis and parallel to the stage base 15. As the center slider 12, an X-Y transfer stage as shown in FIG. 4 can also be used.

Figure 5:
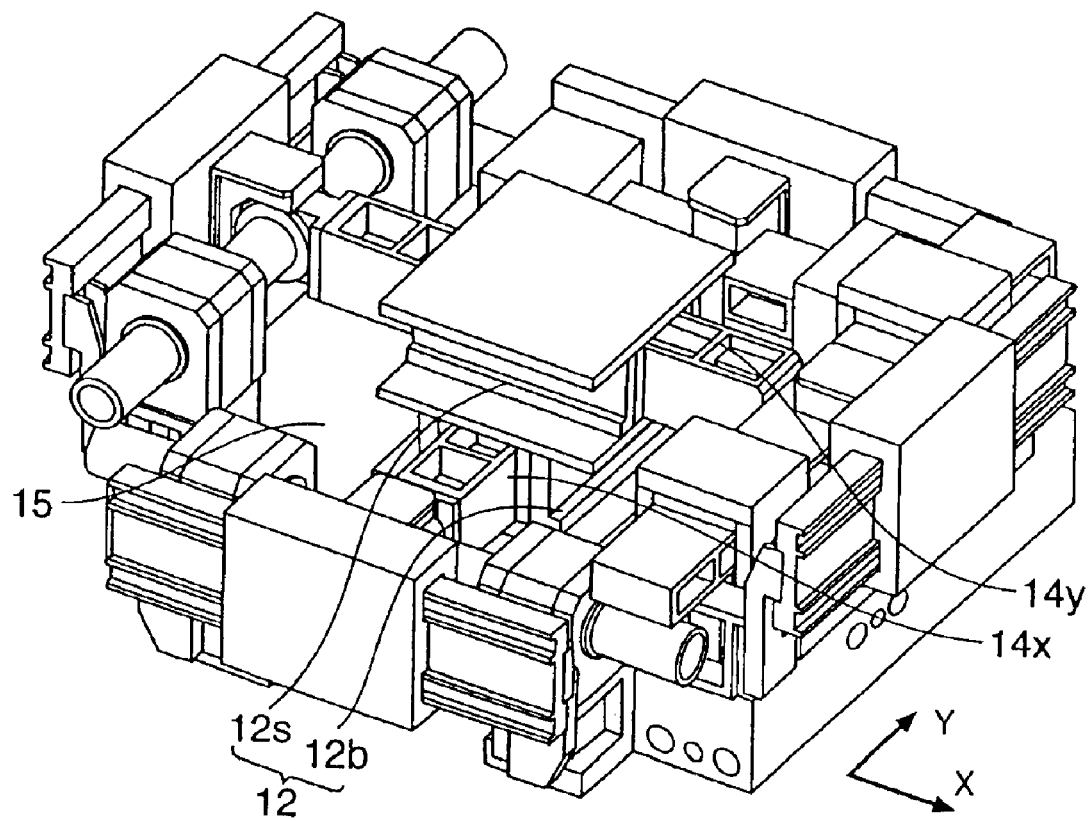
FIG. 5 is a view showing an X-Y transfer stage.
Figure 6:
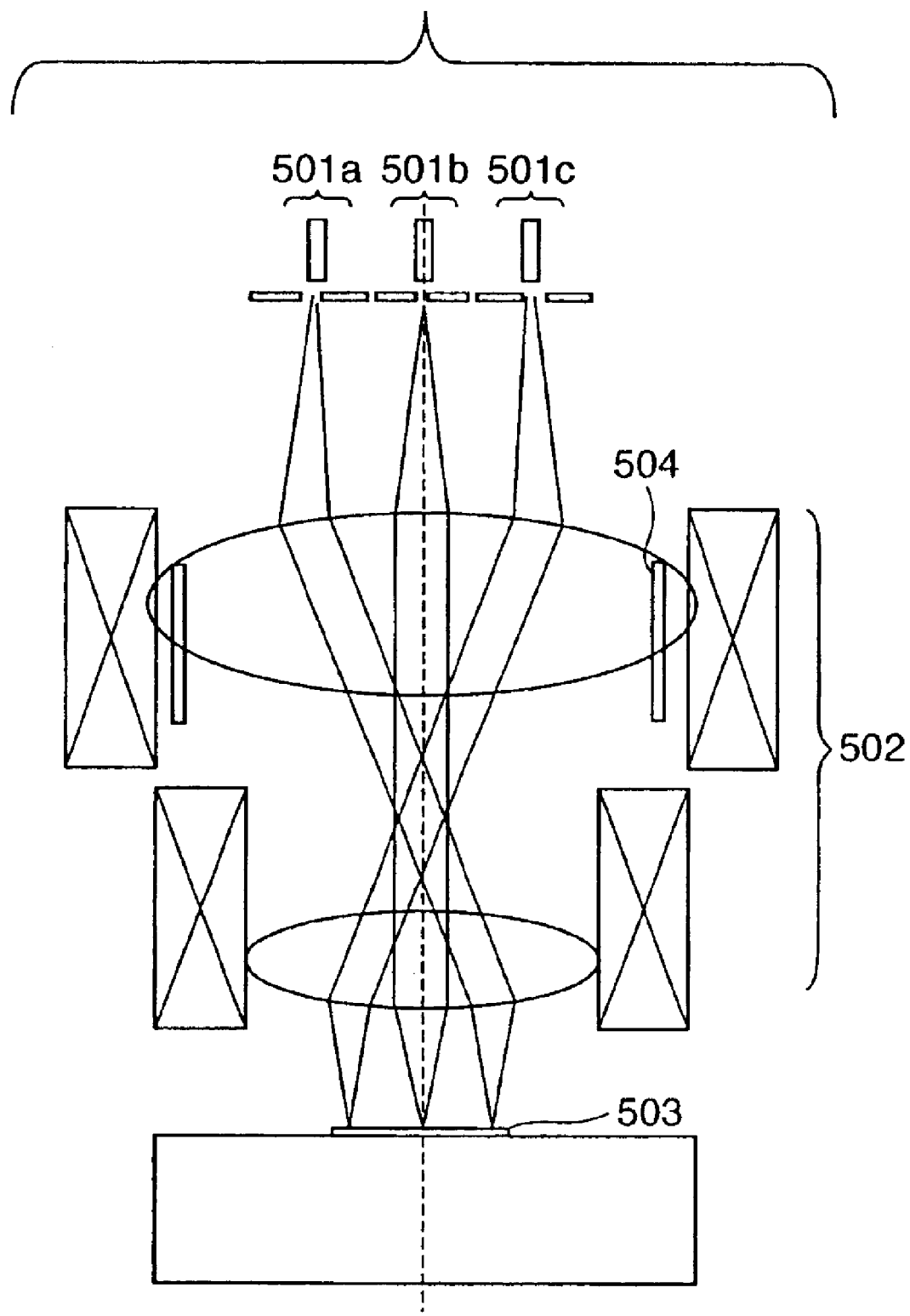
FIG. 6 is a view showing the outline of a multi electron beam exposure apparatus.
Figure 7:
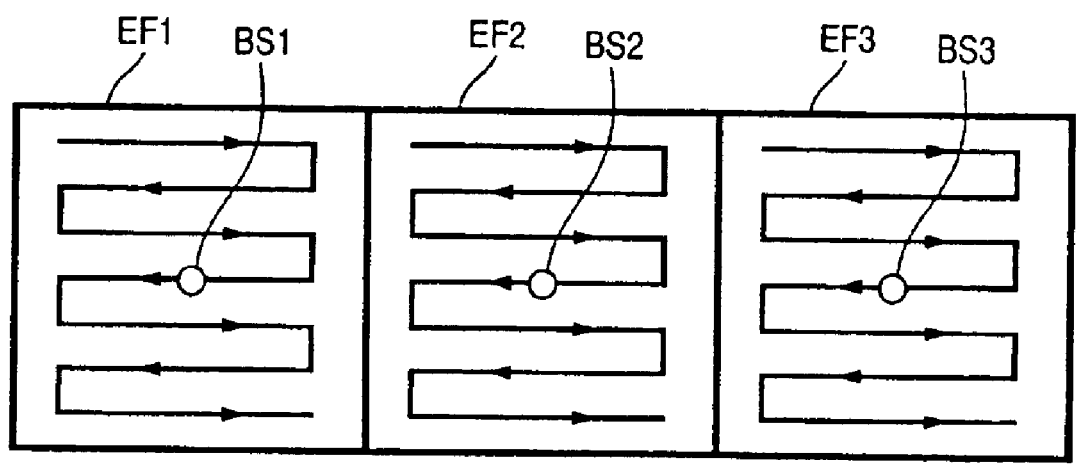
FIG. 7 is a view showing how the multi electron beam exposure apparatus of FIG. 6 scans a wafer with a plurality of electron beams.
Figure 7:
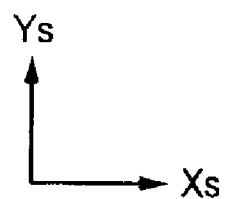

The center slider 12 will be described in detail with reference to FIG. 5. The center slider 12 comprises a bottom plate 12b and side plates 12s. Below the bottom plate 12b, bearings are arranged on the stage base 15 to face each other. Inside the side plates 12s, the X movable guide 14x and Y movable guide 14y are sandwiched between bearings.

As shown in FIG. 2, a θ linear motor movable element 106, which constitutes a part of an electromagnetic actuator and a θ linear motor stator 106', which constitutes the remainder of the electromagnetic actuator, are provided between the θZ tilt stage 11 and the center slider 12. The θ linear motor movable element 106 and θ linear motor stator 106' drive the θZ tilt stage 11 in at least the rotation direction about the Z-axis with respect to the center slider 12. More specifically, the θ linear motor movable element 106 is fixed at the end of the θZ tilt stage 11, and the θ linear motor stator 106', is fixed on the bottom plate 12b of the transfer stage 12 to face the θ linear motor movable element 106. Since the θ linear motor movable element 106 and θ linear motor stator 106' are in non-contact with each other, the substrate stage can be driven in a non-contact manner. From a thermal viewpoint, it is preferable that the θ linear motor movable element 106 comprises a magnet, and the θ linear motor stator 106' comprises a coil.

The θ linear motor movable element 106 and θ linear motor stator 106' are preferably coated with multiple electromagnetic shields. For this reason, a magnet serving as the θ linear motor movable element 106 is preferably coated with multiple electromagnetic shields of, e.g., permalloy to avoid any variation in the magnetic field. In addition, the magnet serving as the θ linear motor movable element 106 is preferably spaced apart from the reduction electron optical system 4 by a sufficient distance to avoid any variation in magnetic field due to a leakage magnetic field from the reduction electron optical system 4. More specifically, the θ linear motor movable element 106 and the wafer 5 are desirably located on the opposite sides of the barycenter of the center slider 12 in the Z-axis direction. The θ linear motor stator 106' may be arranged on the tilt frame 13.

The center slider 12 has the X movable guide 14x and Y movable guide 14y arranged in the shape of a cross. The center slider 12 moves smoothly along the side surface of the Y movable guide 14y and the upper surface of the stage base 15 in the X-axis direction by moving the X movable guide 14x in the X-axis direction and moves smoothly along the side surface of the X movable guide 14x and the upper surface of the stage base 15 in the Y-axis direction by moving the Y movable guide 14y in the Y-axis direction.

The tilt frame 13 is supported through Z actuators 107 for driving the θZ tilt stage 11 above the bottom plate 12b of the center slider 12 in the Z direction. As the Z actuators 107, piezoelectric devices with guides which are rigid in the X-Y plane may be used. The tilt frame 13 has θ free leaf springs 108, each serving as a connecting member with a degree of freedom in only the θ direction (rotation direction about the Z-axis). The θZ tilt stage 11 is supported by the tilt frame 13 through the θ free leaf springs 108. Some of the θ free leaf springs 108 are arranged in the X-axis direction, and the others, in the Y-axis direction. The θZ tilt stage 11 is rigid with respect to the tilt frame 13 in the Z-axis direction. The tilt frame 13 is arranged to surround the center slider 12.

As described above, according to this embodiment, the electromagnetic actuator is provided between the substrate stage and the transfer stage. With this arrangement, the substrate stage can be driven in a non-contact manner in at least the rotation direction about the Z-axis, thus preventing vibrations from being transmitted from the transfer stage to the substrate stage. For this reason, stages (the substrate stage and transfer stage) having high-frequency band control characteristics with respect to the rotation direction about the Z-axis can be implemented. Consequently, in an electron beam exposure apparatus having these stages, especially in an electron beam exposure apparatus using a plurality of electron beams, a degradation in drawing accuracy caused by a yawing component generated in stage scanning can be reduced, and high-accuracy exposure can be realized.

[Second Embodiment]

Figure 3A:
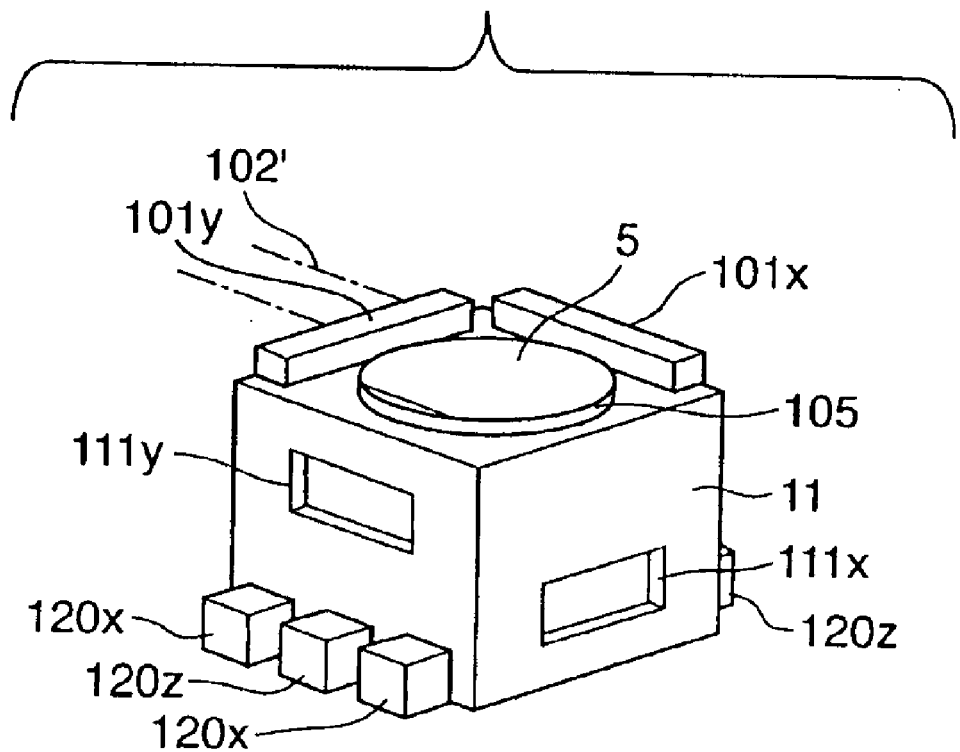
FIGS. 3A and 3B are views showing the stage of an electron beam exposure apparatus according to the second embodiment of the present invention.
Figure 3A:
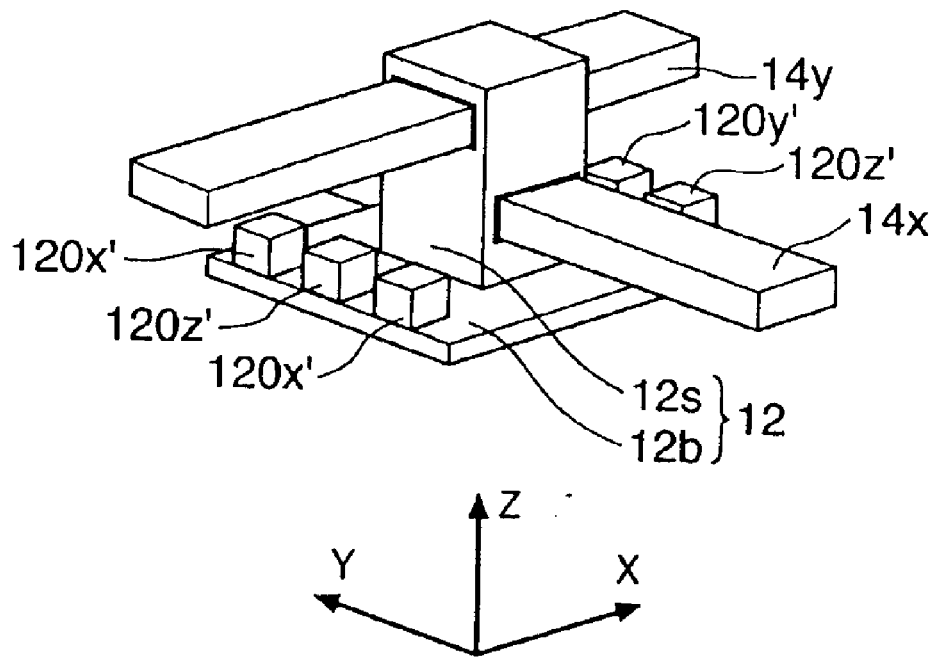
Figure 3B:
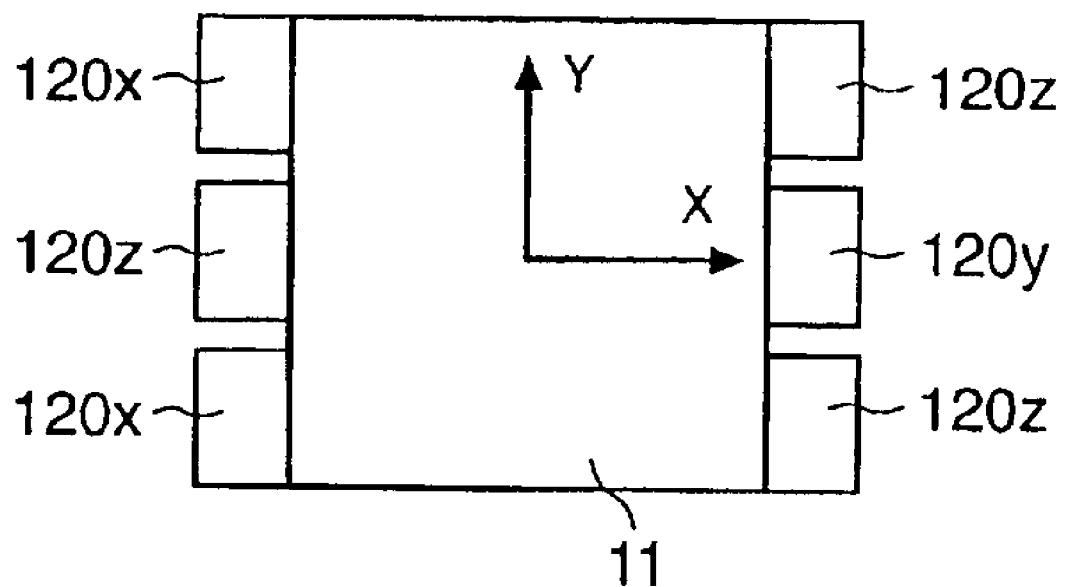

FIGS. 3A and 3B are views showing an electron beam exposure apparatus according to the second embodiment of the present invention.

In this embodiment, a plurality of electromagnetic actuators are combined. With this arrangement, a θZ tilt stage 11 can be driven with six degrees of freedom. As shown in FIG. 3A, the θZ tilt stage 11 has a cage structure surrounding a center slider 12 and has apertures 111x and 111y, through which an X movable guide 14x and a Y movable guide 14y extend. Six linear motor movable elements 120x, 120y, and 120z, which constitute parts of respective electromagnetic actuators, are fixed on the side surface of the θZ tilt stage 11. Linear motor stators 120x', 120y', and 120z', which constitute the remainders of the respective electromagnetic actuators, are fixed on a bottom plate 12b to face the linear motor movable elements 120x, 120y, and 120z, respectively. As shown in FIG. 3B, the driving directions of the respective linear motors as electromagnetic actuators are determined by the three linear motor movable elements 120z, which generate a driving force in the Z-axis direction, the two linear motor movable elements 120x, which generate a driving force in the X-axis and θ (rotation direction about the Z-axis) directions, and one linear motor movable element 120y, which generates a driving force in the Y-axis direction. An electromagnetic actuator which generates a driving force in the rotation direction about the X-axis and one which generates a driving force in the rotation direction about the Y-axis may also be provided in the same manner. As described above, since a plurality of linear motors for a plurality of directions are combined, the θZ tilt stage 11 can be driven with six degrees of freedom. A method of combining linear motors, however, is not limited to this.

In this embodiment, the tilt frame 13 shown in FIG. 2 is not always necessary. Since the linear motor movable elements and linear motor stators are in non-contact with each other, the substrate stage can be driven in a non-contact manner. It is thermally preferable that each linear motor movable element comprises a magnet, and each linear motor stator comprises a coil. Each electromagnetic actuator is preferably coated with multiple electromagnetic shields. For this reason, a magnet serving as the linear motor movable element is preferably coated with multiple electromagnetic shields of, e.g., permalloy to avoid any variation in magnetic field. In addition, the magnet serving as the linear motor movable element is preferably spaced apart from a reduction electron optical system 4 by a sufficient distance to avoid any variation in magnetic field due to a leakage magnetic field from the reduction electron optical system 4. More specifically, each linear motor movable element and the wafer 5 are desirably located on the opposite sides of the barycenter of the center slider 12 in the Z-axis direction.

[Third Embodiment]

Figure 4A:
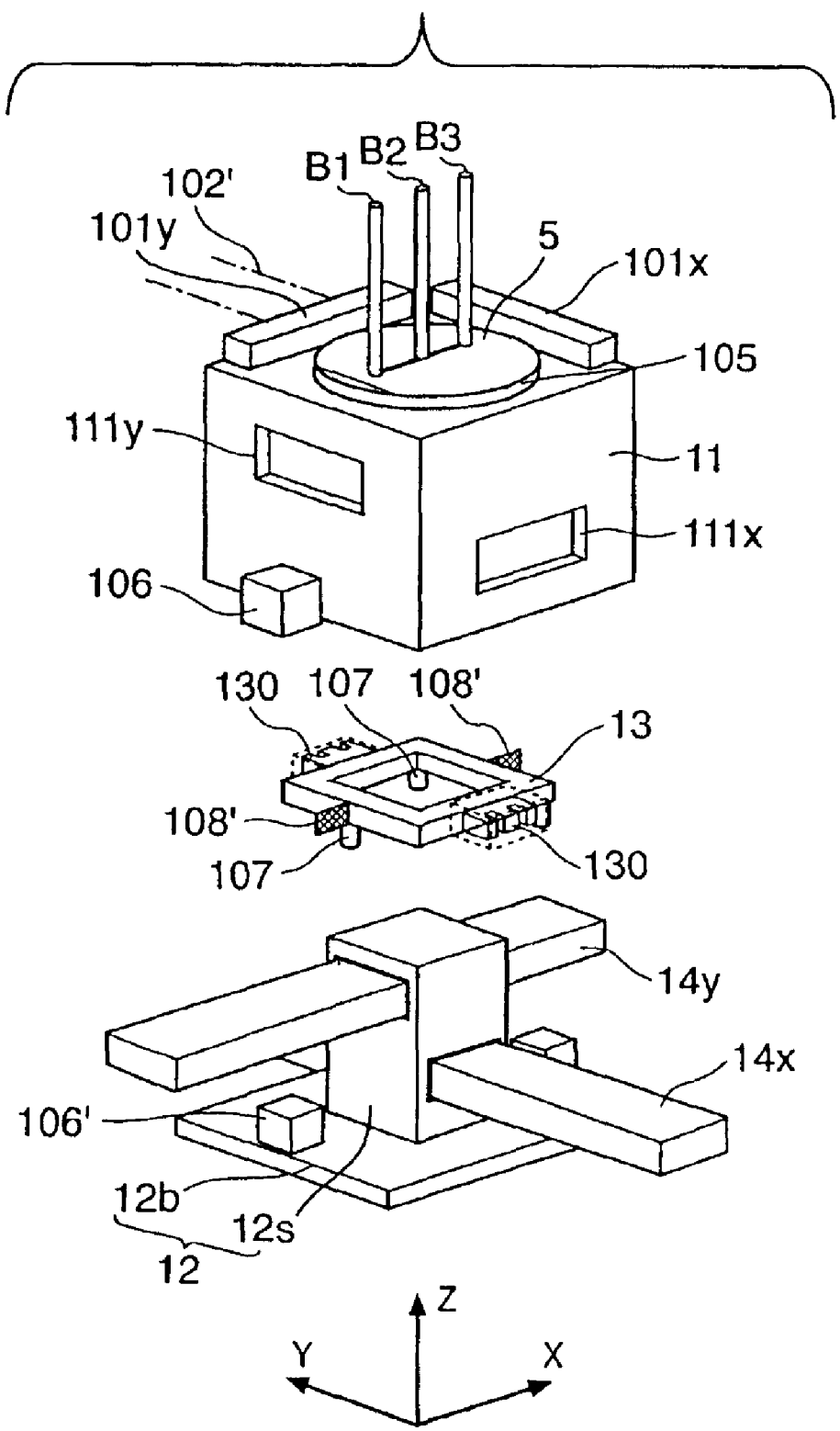
FIGS. 4A and 4B are views showing the stage of an electron beam exposure apparatus according to the third embodiment of the present invention.
Figure 4B:
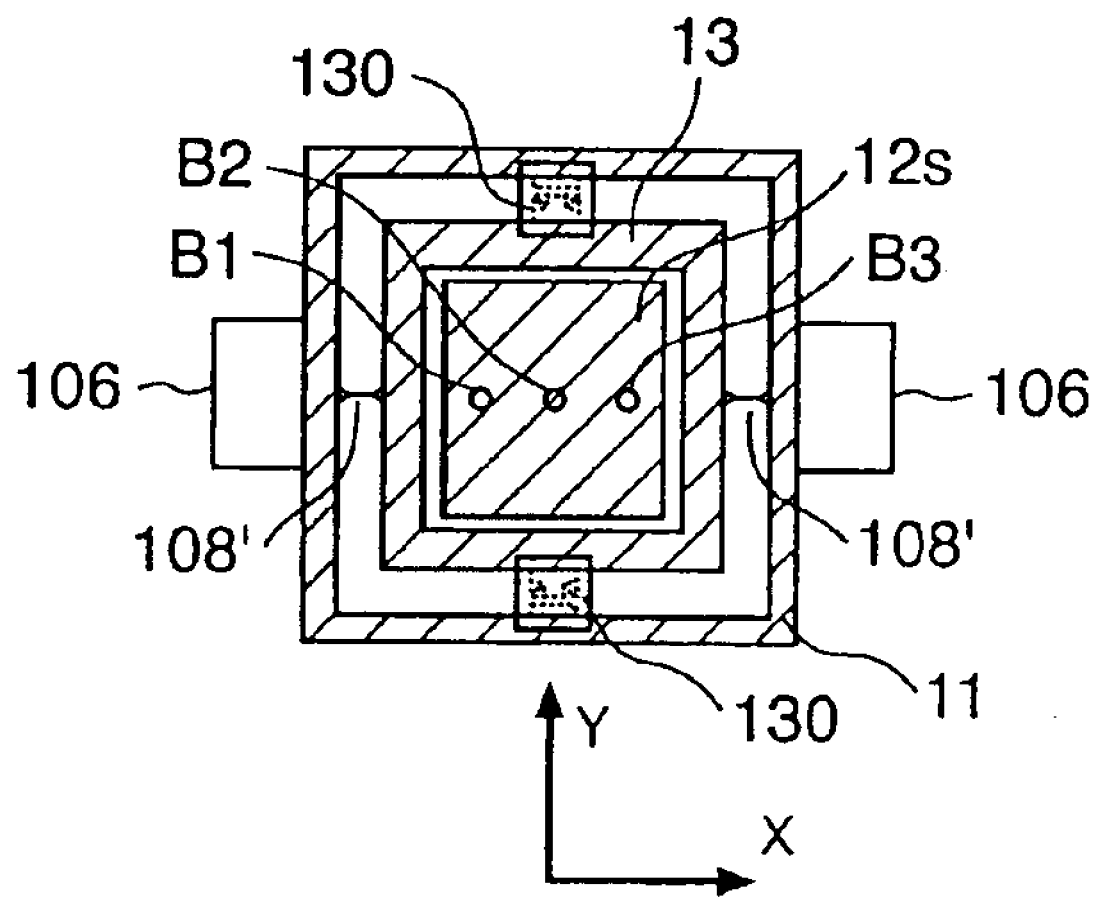

FIGS. 4A and 4B are views showing an electron beam exposure apparatus according to the third embodiment of the present invention. The Y-axis direction in this embodiment is a direction perpendicular to the array direction of a plurality of electron beams (B1, B2, B3, . . . ). As shown in FIG. 4A, the θ measurement 102' is preferably performed in a direction perpendicular to the array direction of the plurality of beams. A tilt frame 13 is supported on a bottom plate 12b of a center slider 12 through Z actuators 107 for driving a θZ tilt stage 11 in the Z direction. The tilt frame 13 is arranged to surround the center slider 12. As the Z actuators 107, piezoelectric devices with guides which are rigid in the X-Y plane may be used. The θZ tilt stage 11 is supported on the tilt frame 13 through θ free leaf springs 108 serving as a connecting member with a degree of freedom in only the θ direction (rotation direction about the Z-axis). The θ free leaf springs 108 are arranged in the X-axis direction, and the others, in the Y-axis direction. The θZ tilt stage 11 is rigid with respect to the tilt frame 13 in the Z-axis direction. The θZ tilt stage 11 has a cage structure surrounding the center slider 12 and has apertures 111x and 111y, through which an X movable guide 14x and a Y movable guide 14y extend.

A θ linear motor movable element 106, which constitutes a part of an electromagnetic actuator, is fixed on the side surface of the θZ tilt stage 11. A θ linear motor stator 106' which constitutes the remainder of the electromagnetic actuator is fixed on the bottom plate 12b to face the θ linear motor movable element 106. Since the θ linear motor movable element 106 and θ linear motor stator 106' are in non-contact with each other, the substrate stage can be driven in a non-contact manner. It is thermally preferable that the θ linear motor movable element 106 comprises a magnet, and the θ linear motor stator 106' comprises a coil. The θ linear motor movable element 106 and θ linear motor 106' are preferably coated with multiple electromagnetic shields. For this reason, a magnet serving as the θ linear motor movable element 106 is preferably coated with multiple electromagnetic shields of, e.g., permalloy to avoid any variation in magnetic field. In addition, the magnet serving as the θ linear motor movable element 106 is preferably spaced apart from a reduction electron optical system 4 by a sufficient distance to avoid any variation in magnetic field due to a leakage magnetic field from the reduction electron optical system 4. More specifically, the θ linear motor movable element 106 and the substrate are desirably located on the opposite sides of the barycenter of the center slider 12 in the Z-axis direction. The θ linear motor stator 106' may be arranged on the tilt frame 13.

Moreover, in this embodiment, the tilt frame 13 comprises electromagnets 130 as electromagnetic actuators which are actuated in only the Y-axis direction, as shown in FIG. 4B. This can reduce the load on the θ linear motor at the time of acceleration/deceleration in the Y-axis direction and the size of the θ linear motor (the θ linear motor movable element 106 and θ linear motor stator 106'). Each electromagnet 130 is preferably coated with multiple electromagnetic shields of, e.g., permalloy to avoid any variation in magnetic field. In addition, the electromagnet 130 is preferably spaced apart from the reduction electron optical system 4 by a sufficient distance to avoid any variation in magnetic field due to a leakage magnetic field from the reduction electron optical system 4.

[Other Embodiment]

Figure 8:
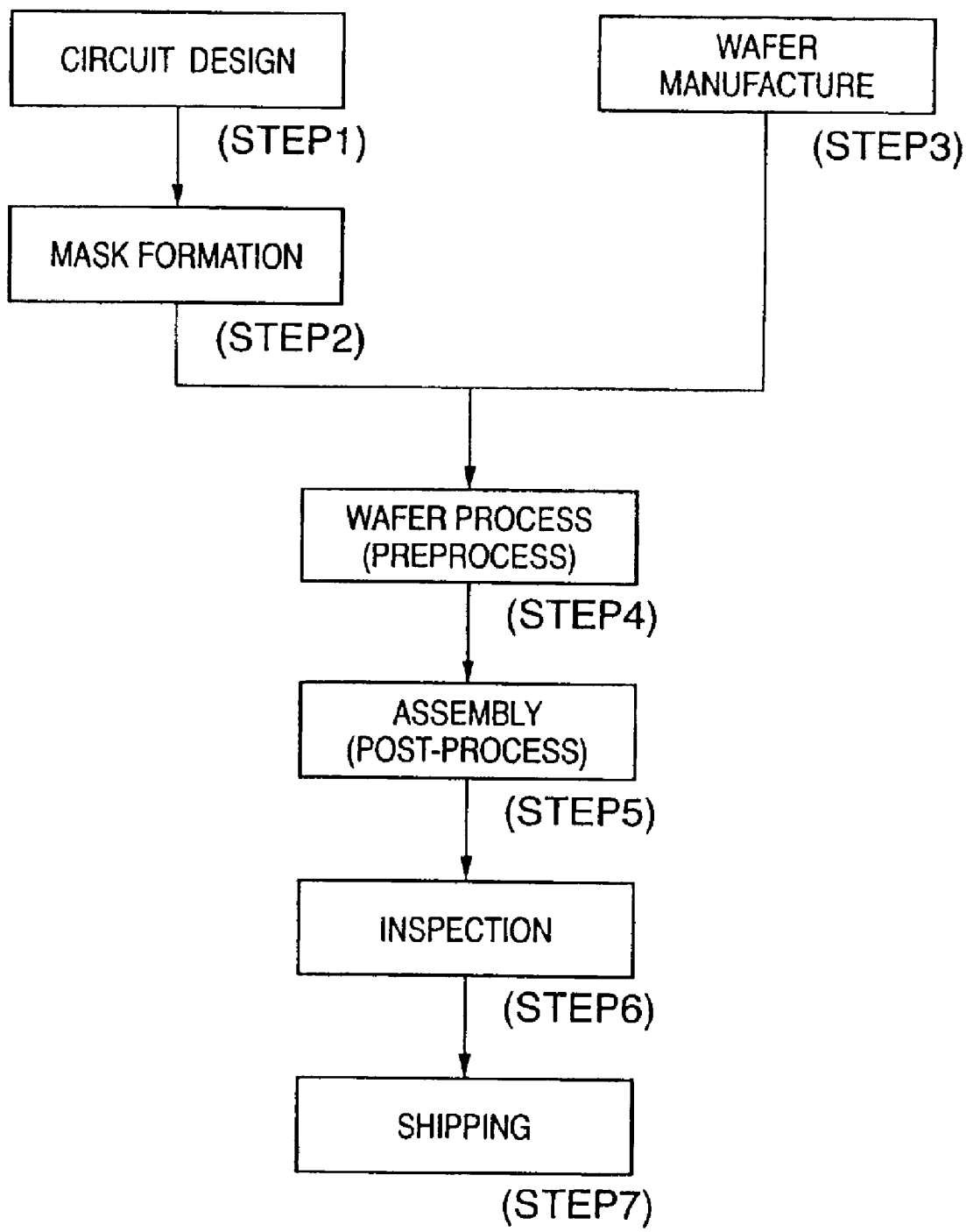
FIG. 8 is a flow chart showing the flow of the whole manufacturing process of a semiconductor device.

The manufacturing process of a semiconductor device using an electron beam exposure apparatus according to a preferred embodiment of the present invention will be described next. FIG. 8 shows the flow of the whole manufacturing process of the semiconductor device. In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process), called a preprocess, an actual circuit is formed on the wafer by lithography using the prepared mask and wafer. Step 5 (assembly), called a post-process, is the step of forming a semiconductor chip by using the wafer formed in step 4, and includes an assembly process (chip encapsulation). In step 6 (inspection), the semiconductor device manufactured in step 5 undergoes inspections such as an operation confirmation test and a durability test. After these steps, the semiconductor device is completed and shipped (step 7).

Figure 9:
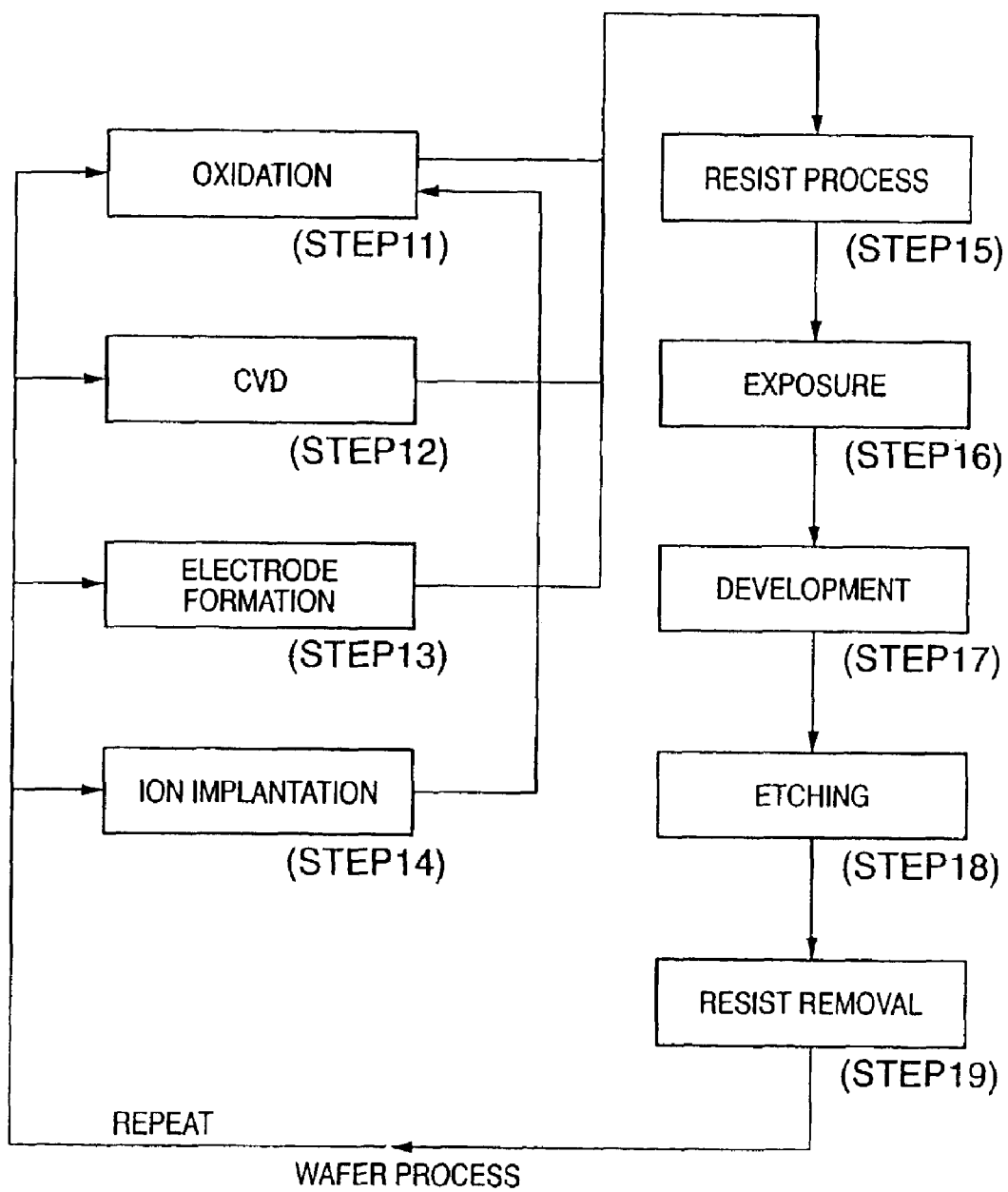
FIG. 9 is a flow chart showing the detailed flow of the wafer process.

FIG. 9 shows the detailed flow of the above-mentioned wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the circuit pattern is transferred onto the wafer using the above-mentioned electron beam exposure apparatus. In step 17 (development), the exposed wafer is developed. In step 18 (etching), the resist is etched except for the developed resist image. In step 19 (resist removal), an unnecessary resist after etching is removed. These steps are repeated to form multiple circuit patterns on the wafer.

As has been described above, the present invention can provide an electron beam exposure apparatus capable of, e.g., reducing a degradation in drawing accuracy and performing high-accuracy exposure.

As many apparently widely different embodiments of the present invention can be made without departing from the spirit and scope thereof, it is to be understood that the invention is not limited to the specific embodiments thereof except as defined in the appended claims.

What is claimed is:

1. An electron beam exposure apparatus which exposes a substrate with a predetermined pattern using a plurality of electron beams, said apparatus comprising:
   a substrate stage on which a substrate is mounted;
   a transfer stage which drives said substrate stage on an X-Y plane;
   an electromagnetic actuator which drives said substrate stage in a rotation direction about a Z-axis with respect to said transfer stage; and
   a measuring system which measures a position of said substrate stage in the rotation direction about the Z-axis using a measuring beam along a direction perpendicular to the plurality of electron beams.

2. The apparatus according to claim 1, wherein said electromagnetic actuator includes a movable element and a stator, the movable element is fixed on said substrate stage, and the stator is fixed on said transfer stage.

3. The apparatus according to claim 2, wherein the movable element and the stator are in non-contact to each other.

4. The apparatus according to claim 3, wherein the movable element comprises a magnet, and the stator comprises a coil.

5. The apparatus according to claim 1, wherein the apparatus further comprises a Z actuator for driving said substrate stage in a Z direction and a tilt frame which is supported on said transfer stage through the Z actuator, and said substrate stage is connected to the tilt frame.

6. The apparatus according to claim 5, wherein the tilt frame has a connecting member with a degree of freedom in the rotation direction about the Z-axis, and said substrate stage is supported on the tilt frame through the connecting member.

7. The apparatus according to claim 1, further comprising a second electromagnetic actuator arranged between said substrate stage and said transfer stage to drive said substrate stage in at least one of a rotation direction about an X-axis, a rotation direction about a Y-axis, a Z-axis direction, and an X-Y direction with respect to the transfer stage.

8. The apparatus according to claim 1, wherein said electromagnetic actuator comprises a plurality of electromagnetic actuators, and the plurality of electromagnetic actuators are combined to drive said substrate stage with six degrees of freedom.

9. The apparatus according to claim 8, wherein each electromagnetic actuator and said substrate stage are arranged on opposite sides of a center of gravity of said transfer stage in the Z-axis direction.

10. The apparatus according to claim 1, wherein said electromagnetic actuator is covered with an electromagnetic shield.

11. An electron beam exposure apparatus using a plurality of electron beams, said apparatus comprising:
   a substrate stage on which a substrate is mounted;
   a transfer stage which drives said substrate stage on an X-Y plane;
   an electromagnetic actuator which drives said substrate stage, in a rotation direction about a Z-axis and a direction perpendicular to an array direction of the plurality of electron beams, with respect to said transfer stage; and
   a measuring system which measures a position of said substrate stage in the rotation direction about the Z-axis using a measuring beam along a direction perpendicular to the plurality of electron beams.

12. The apparatus according to claim 11, wherein the apparatus further comprises a Z actuator for driving said substrate stage in a Z direction and a tilt frame which is supported on said transfer stage through the Z actuator, and said substrate stage is connected to the tilt frame.

13. The apparatus according to claim 12, wherein the tilt frame has a connecting member with a degree of freedom in the rotation direction about the Z-axis, and said substrate stage is supported on the tilt frame through the connecting member.

14. The apparatus according to claim 13, wherein the tilt frame further comprises a second electromagnetic actuator which is actuated in a direction perpendicular to the array direction of the plurality of electron beams.

15. A semiconductor device manufacturing method comprising:
   a coating step of coating a substrate with a photosensitive agent;
   an exposure step of transferring a pattern onto the substrate coated with the photosensitive agent using an electron beam exposure apparatus as defined in claim 1; and
   a development step of developing the photosensitive agent on the substrate, onto which the pattern is transferred in the exposure step.

* * * * *

UNITED STATES PATENT AND TRADEMARK OFFICE
CERTIFICATE OF CORRECTION

PATENT NO. : 6,930,756 B2
DATED : August 16, 2005
INVENTOR(S) : Kotaro Akutsu et al.

It is certified that error appears in the above-identified patent and that said Letters Patent is hereby corrected as shown below:

Column 2,
Line 37, "electron-beams" should read -- electron beams --.

Column 10,
Line 3, "process (chip" should read -- process (dicing and bonding) and packing process (chip --.

Signed and Sealed this

Tenth Day of January, 2006

JON W. DUDAS
*Director of the United States Patent and Trademark Office*